United States Patent
Song et al.

(10) Patent No.: US 11,239,441 B2
(45) Date of Patent: Feb. 1, 2022

(54) LIGHTING APPARATUS USING ORGANIC LIGHT EMITTING DIODE

(71) Applicant: LG Display Co., Ltd., Seoul (KR)

(72) Inventors: TaeJoon Song, Paju-si (KR); Jungeun Lee, Seoul (KR); Taeok Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/517,131

(22) Filed: Jul. 19, 2019

(65) Prior Publication Data
US 2020/0035943 A1    Jan. 30, 2020

(30) Foreign Application Priority Data
Jul. 25, 2018  (KR) .......................... 10-2018-0086402

(51) Int. Cl.
*H01L 51/52* (2006.01)

(52) U.S. Cl.
CPC ...... *H01L 51/5228* (2013.01); *H01L 51/5218* (2013.01); *H01L 51/5234* (2013.01); *H01L 51/5275* (2013.01)

(58) Field of Classification Search
CPC .................................................. H01L 51/5218
USPC .......................................................... 257/40
See application file for complete search history.

(56) References Cited

U.S. PATENT DOCUMENTS

| 2005/0007015 | A1* | 1/2005 | Yokoyama | H01L 51/5218 |
| | | | | 313/506 |
| 2005/0230684 | A1* | 10/2005 | Seo | H01L 27/3248 |
| | | | | 257/72 |
| 2012/0098008 | A1 | 4/2012 | Song et al. | |
| 2017/0038872 | A1* | 2/2017 | Jiang | G02F 1/134309 |
| 2017/0040278 | A1* | 2/2017 | Hattori | H01L 24/17 |
| 2017/0285428 | A1* | 10/2017 | Seong | G09G 3/3648 |

FOREIGN PATENT DOCUMENTS

| CN | 101226954 A | 7/2008 |
| CN | 103579283 A | 2/2014 |
| CN | 106601770 A | 4/2017 |
| CN | 107579093 A | 1/2018 |
| JP | 2001-223087 A | 8/2001 |
| KR | 10-2006-0042728 | 5/2006 |

OTHER PUBLICATIONS

Chinese Office Action dated Jul. 26, 2021 issued in Patent Application No. 201910634374.1 w/English Translation (16 pages).

* cited by examiner

*Primary Examiner* — Hsin Yi Hsieh
(74) *Attorney, Agent, or Firm* — Polsinelli PC

(57) ABSTRACT

A lighting apparatus using an organic light emitting diode that has an emission area and a non-emission area, the light emitting apparatus comprises a first electrode; an organic layer disposed on the first electrode; a second electrode disposed on the organic layer; and an insulating layer disposed in the non-emission area, wherein the first electrode disposed in the emission area includes at least one metal layer and at least one dielectric layer, and wherein the first electrode disposed in the non-emission area includes at least one dielectric layer.

17 Claims, 15 Drawing Sheets

LIGHTING APPARATUS USING ORGANIC LIGHT EMITTING DIODE

CROSS-REFERENCE TO RELATED APPLICATION

This application claims the priority of Korean Patent Application No. 10-2018-0086402 filed on Jul. 25, 2018, in the Korean Intellectual Property Office, which is incorporated by reference in its entirety.

BACKGROUND

Field of the Disclosure

The present disclosure relates to a lighting apparatus using an organic light emitting diode, and more particularly, to a lighting apparatus using an organic light emitting diode with improved front luminance.

Description of the Background

Currently, fluorescent lamps or incandescent lamps are mainly used as lighting apparatuses. Among them, the incandescent lamps have a good color rendering index (CRI), but have very low energy efficiency. Further, the fluorescent lamps have good efficiency, but have a low color rendering index and contain mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. A CRI of sunlight is 100.

In order to solve the problems of the lighting apparatus of the related art, recently, a light emitting diode (LED) is suggested as a lighting apparatus. The light emitting diode is made of an inorganic light emitting material. Luminous efficiency of the light emitting diode is the highest in the red wavelength range and the luminous efficiency thereof is lowered toward a red wavelength range and a green wavelength range which has the highest visibility. Therefore, there is a disadvantage in that when a red light emitting diode, a green light emitting diode, and a blue light emitting diode are combined to emit white light, the luminous efficiency is lowered.

As another alternative, a lighting apparatus using an organic light emitting diode (OLED) has been developed. The lighting apparatus using an organic light emitting diode emits light at various angles so that the luminance of the lighting apparatus is dispersed not only to the front, but also to the side.

Therefore, like a lighting apparatus of a vehicle, when there is a necessity to concentrate the front luminance, if the lighting apparatus using an organic light emitting diode is used as a lighting apparatus for a vehicle, there is a problem in that the front luminance does not reach a reference value.

SUMMARY

The present disclosure is to provide a lighting apparatus using an organic light emitting diode with improved front luminance.

In addition, the present disclosure is to provide a lighting apparatus using an organic light emitting diode suitable for a lighting apparatus of a vehicle.

Further, the present disclosure is to provide a lighting apparatus using an organic light emitting diode which restricts a current flowing into a short generating area.

The present disclosure is not limited to the above-mentioned aspects, which are not mentioned above, can be clearly understood by those skilled in the art from the following descriptions.

In order to solve the above-described problems, according to an aspect of the present disclosure, a lighting apparatus using an organic light emitting diode that has an emission area and a non-emission area, the light emitting apparatus comprises a first electrode; an organic layer disposed on the first electrode; a second electrode disposed on the organic layer; and an insulating layer disposed in the non-emission area, wherein the first electrode disposed in the emission area includes at least one metal layer and at least one dielectric layer, and wherein the first electrode disposed in the non-emission area includes at least one dielectric layer.

Other detailed matters of the exemplary embodiments are included in the detailed description and the drawings.

According to the present disclosure, a first electrode is formed as a triple layer to deflect light generated in the organic light emitting diode unit.

According to the present disclosure, a unit structure of an external light extracting layer is formed to have a regular four-sided pyramid shape to improve the front luminance of the lighting apparatus.

According to the present disclosure, a first electrode in which a narrow path is implemented is formed by only at least one dielectric layer so that the current flowing in a short generating area may be restricted.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
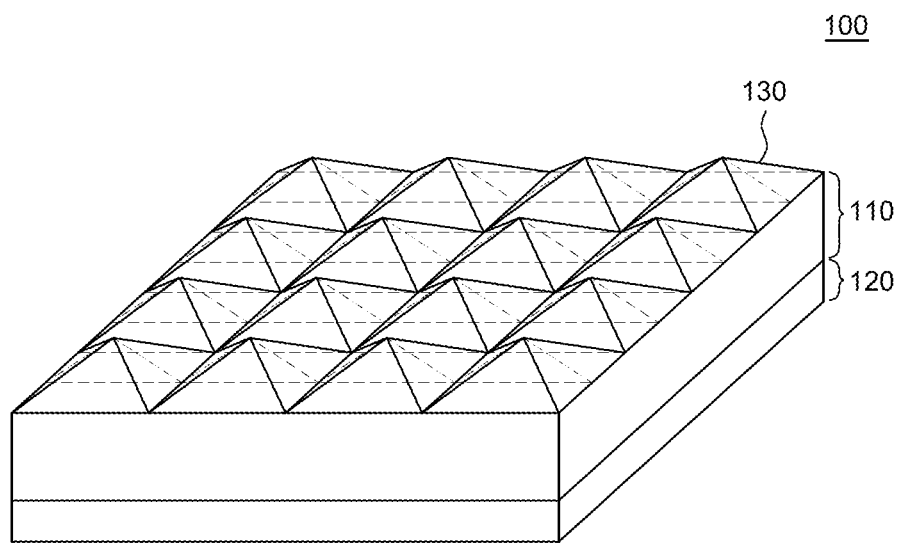
FIG. 1 is a perspective view of a lighting apparatus using an organic light emitting diode according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light apparatus according to exemplary embodiments of the present disclosure will be described in detail with reference to accompanying drawings.

Figure 2:
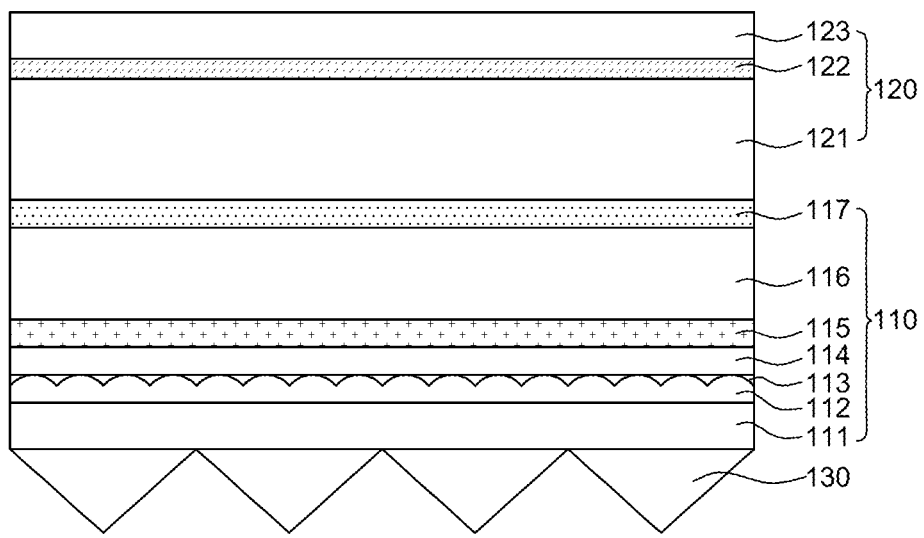
FIG. 2 is a cross-sectional view of a lighting apparatus using an organic light emitting diode according to an exemplary embodiment of the present disclosure.

FIG. 1 is a perspective view of a lighting apparatus using an organic light emitting diode according to an exemplary embodiment of the present disclosure and FIG. 2 is a cross-sectional view of a lighting apparatus using an organic light emitting diode according to an exemplary embodiment of the present disclosure.

Referring to FIG. 1, a lighting apparatus 100 using an organic light emitting diode according to an exemplary embodiment of the present disclosure includes an organic light emitting diode unit 110 which performs surface emission, an encapsulating unit 120 which encapsulates the organic light emitting diode unit 110, and an external light extracting layer 130 which refracts the light emitted from the organic light emitting diode unit 110 to the front side.

Specifically, referring to FIG. 2, the organic light emitting diode unit 110 may include a substrate 111, an internal light extracting layer 112, a planarizing layer 113, a barrier layer 114, a first electrode 115, an organic layer 116, and a second electrode 117 which are sequentially disposed from the lower side.

In addition, as it will be described below with reference to FIG. 5, the organic light emitting diode unit 110 may further include an auxiliary line AL for compensating a conductivity of the first electrode 115 and an insulating layer INS for suppressing the short of the first electrode 115 and the second electrode 117.

The substrate 111 may be made of transparent glass. Further, the substrate 111 may be made of a polymer material having flexibility.

Here, the organic layer 116 which emits light and the first electrode 115 and the second electrode 117 which are disposed on and below the organic layer 116 to supply charges to the organic layer 116 configure an organic light emitting diode (OLED).

For example, the first electrode 115 may be an anode which supplies holes to the organic layer 116 and the second electrode 117 may be a cathode which supplies electrons to the organic layer 116, but are not limited thereto and the functions of the first electrode 115 and the second electrode 117 may be switched.

Generally, the first electrode 115 is desirably formed of indium tin oxide (ITO) or indium zinc oxide (IZO) which is a transparent metal oxide material having a high work function and good conductivity to easily inject the holes.

However, in the exemplary embodiment of the present disclosure, the first electrode 115 which is a triple layer may be used to form a predetermined angle by the light generated in the organic light emitting diode unit 110 and a normal direction (a vertical direction) of the organic layer 116.

Further, the second electrode 117 is desirably made of a conductive material having a low work function so as to easily inject electrons to the organic layer 116. A specific example of a material used for the second electrode 117 may be made of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof.

The organic layer 116 may be made of a single stack structure including a red organic light emitting layer EML or formed to have a multi-stack tandem structure including a plurality of red organic light emitting layers, or a multi-stack tandem structure including a red-green organic light emitting layer EML and a sky blue organic light emitting layer EML.

Further, the organic layer 116 may include an electron injection layer EIL and a hole injection layer HIL which inject electrons and holes to the organic light emitting layer EML, respectively, and an electron transport layer ETL and a hole transport layer HTL which transport the injected electrons and holes to the light emitting layer, respectively, and a charge generating layer CGL which generates charges such as the electrons and the holes. A specific structure thereof will be described below with reference to FIGS. 3A to 3C.

When a current is applied to the first electrode 115 and the second electrode 117, the electrons are injected from the second electrode 117 to the organic layer 116 and holes are injected from the first electrode 115 to the organic layer 116. Thereafter, excitons are generated in the organic layer 116. As the excitons are decayed, light corresponding an energy difference of a lowest unoccupied molecular orbital (LUMO) and a highest occupied molecular orbital (HOMO) of the light emitting layer is generated.

Here, it is determined whether the light generated in the organic layer 116 is emitted to the front side or to the rear side depending on transmittance and reflectance of the first electrode 115 and the second electrode 117.

In the exemplary embodiment of the present disclosure, as described above, the first electrode 115 is a transparent electrode and the second electrode 117 is used as a reflective electrode. Therefore, the light emitted from the organic layer 116 is reflected by the second electrode 117 to be transmitted through the first electrode 115 so that the light is generated to the lower portion of the organic light emitting diode unit 110. That is, the organic light emitting diode unit 110 according to an exemplary embodiment of the present disclosure may perform bottom emission. However, the present disclosure is not limited thereto and the first electrode 115 is used as a reflective electrode and the second electrode 117 is used as a transparent electrode so that the organic light emitting diode unit 110 may perform top emission.

The barrier layer 114 is disposed below the first electrode 115 to block moisture and air penetrating from the substrate 111 and the internal light extracting layer 112.

In order to perform the above-mentioned function, the barrier layer 114 may be formed of a single layer of an inorganic material such as silicon oxide SiOx or silicon nitride SiNx. If necessary, the barrier layer 114 may be formed by a composite layer of an inorganic material and an organic material.

The internal light extracting layer 112 is disposed between the substrate 111 and the barrier layer 114 to increase the external extracting efficiency of the light generated from the organic light emitting diode which performs the bottom emission.

The internal light extracting layer 112 inserts titanium oxide TiO2 particles into resin to increase internal light scattering and increase surface roughness, thereby increasing optical extraction efficiency. Specifically, the internal light extracting layer 112 may be formed to have a thickness of 450 nm by an inkjet-coating method and a diameter of titanium oxide TiO2 particle may be 200 nm to 300 nm. However, the specific value may vary to various values depending on the necessity of the design of the lighting apparatus 100.

The planarizing layer 113 is disposed on the internal light extracting layer 112 to compensate the surface roughness of the internal light extracting layer 112, thereby improving the reliability of the organic light emitting diode unit 110.

The planarizing layer 113 is made of inserting zirconia particles into resin and compensates the surface roughness of the internal light extracting layer 112. Specifically, the planarizing layer 113 may be formed by the inkjet-coating method to have a thickness of 150 nm and a diameter of the zirconia particle may be 50 nm. However, the specific value may vary to various values depending on the necessity of the design of the lighting apparatus 100.

The encapsulating unit 120 covers the organic light emitting diode unit 110 to protect the organic light emitting diode unit 110 by blocking the influence from the outside. The encapsulating unit 120 includes an adhesive layer 121 which is in contact with the second electrode 117, a metal film 122 which is in contact with the adhesive layer 121, and a protective film 123 attached onto the metal film 122.

The adhesive layer 121 may be made of a pressure sensitive adhesive (PSA) which bonds the metal film 122 and the organic light emitting diode unit 110. A thickness of the adhesive layer 121 may be 30 ☐m, but is not limited thereto and may vary to various values depending on the necessity of the design of the lighting apparatus 100.

The metal film 122 is disposed on the adhesive layer 121 to maintain the rigidity of the lighting apparatus 100. To this end, the metal film 122 may be formed of copper (Cu) having a thickness of 20 ☐m, but is not limited thereto and may vary in various forms depending on the necessity of the design of the lighting apparatus 100.

The protective film 123 is disposed on the metal film 122 to absorb the external impact of the lighting apparatus 100 and protect the lighting apparatus 100. To this end, the protective film 123 may be formed of a polyethylene terephthalate (PET) film which is a polymer film having a thickness of 100 ☐m, but is not limited thereto and may vary in various forms depending on the necessity of the design of the lighting apparatus 100.

Figure 3A:
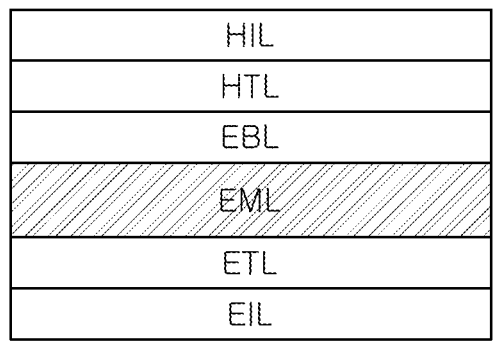
FIGS. 3A to 3C are cross-sectional views illustrating a stack structure of an organic layer according to an exemplary embodiment of the present disclosure.
Figure 3B:
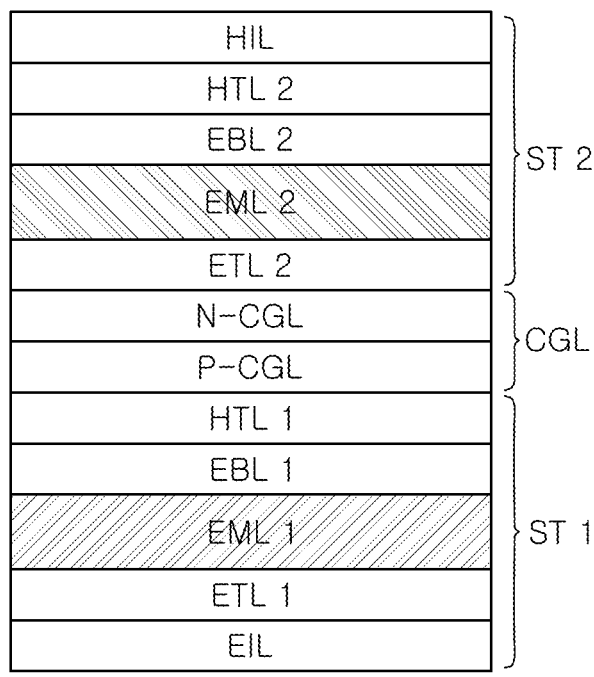
Figure 3C:
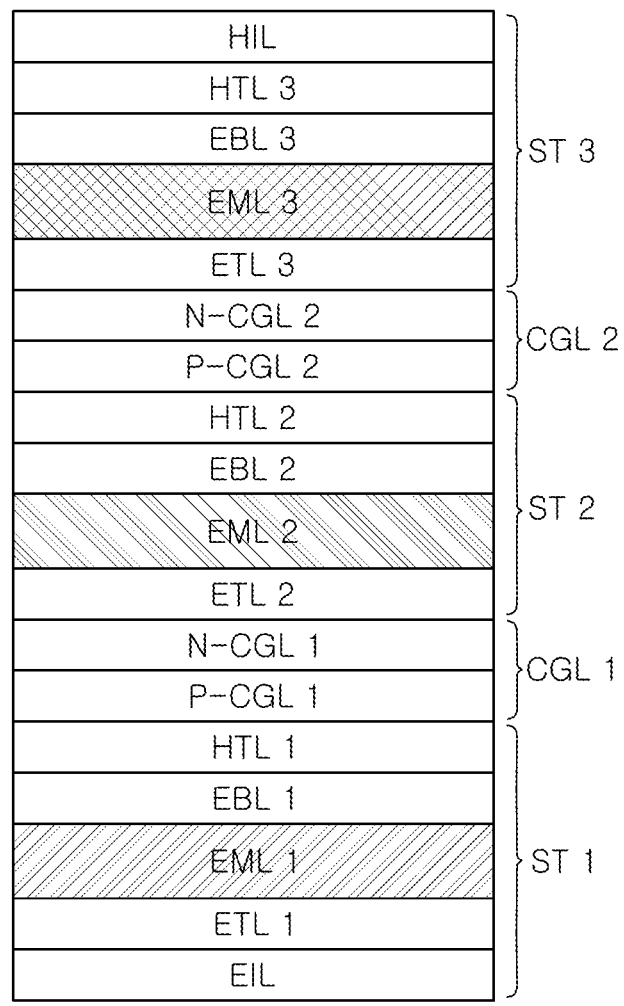

FIGS. 3A to 3C are cross-sectional views illustrating a stack structure of an organic layer according to an exemplary embodiment of the present disclosure;

Specifically, FIG. 3A illustrates an organic layer 116 having a single stack, FIG. 3B illustrates an organic layer 116 having a tandem structure including a double stack, and FIG. 3C illustrates an organic layer 116 having a tandem structure including a triple stack.

Referring to FIG. 3A, the organic layer 116 is configured by a hole injection layer (HIL), a hole transport layer (HTL), an electron blocking layer (EBL), an organic light emitting layer (EML), an electron transport layer (ETL), and an electron injection layer (EIL) which are sequentially laminated.

The hole injection layer HIL is an organic layer which smoothly injects the hole from the first electrode 115 to the organic light emitting layer EML. The hole injection layer HIL may be formed of a material including any one or more of HAT-CN(dipyrazino[2,3-f:2',3'-h]quinoxaline-2,3,6,7, 10.11-hexacarbonitrile), CuPc(phthalocyanine), F4-TCNQ (2,3,5,6-tetrafluoro-7,7,8,8-tetracyano-quinodimethane), and NPD(N,N'-bis(naphthalene-1-yl)-N,N'-bis(phenyl)-2,2'-dimethylbenzidine), but is not limited thereto.

The hole transport layer HTL is an organic layer which smoothly transmits the holes from the hole injection layer HIL to the organic light emitting layer EML. For example, the hole transport layer HTL may be formed of a material including any one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD (2,2',7,7'-tetrakis(N,N-dimethylamino)-9,9-spirofluorene), and MTDATA(4,4',4'-Tris(N-3-methylphenyl-N-phenyl-amino)-triphenylamine), but is not limited thereto.

The electron blocking layer EBL is an organic layer which blocks the electron injected into the organic light emitting layer EML from crossing over the hole transport layer HTL. The electron blocking layer EBL blocks the movement of the electron to improve the combination of the hole and the electron in the organic light emitting layer EML and improve luminous efficiency of the organic light emitting layer EML. Even though the electron blocking layer EBL may be formed of the same material as the hole transport layer HTL and the hole transport layer HTL and the electron blocking layer EBL may be formed as different layers, it is not limited thereto and the hole transport layer HTL and the electron blocking layer EBL may be combined.

In the organic light emitting layer EML, the holes supplied through the first electrode 115 and the electrons supplied through the second electrode 117 are recombined to generate excitons. Here, an area where the excitons are generated is referred to as an emission area (or emission zone) or a recombination zone.

The organic light emitting layer (EML) is disposed between the hole transport layer HTL and the electron transport layer ETL and includes a material which emits light having a specific color. In this case, the organic light emitting layer EML may include a material which emits red light.

The organic light emitting layer EML may have a host-dopant system, that is, a system in which a host material having a large weight ratio is doped with an emission dopant material having a small weight ratio.

In this case, the organic light emitting layer EML may include a plurality of host materials or include a single host material. The organic light emitting layer EML including a plurality of host materials or a single host material is doped with a red phosphorescent dopant material. That is, the organic light emitting layer EML is a red light emitting layer and a range of a wavelength of light emitted from the organic light emitting layer EML may be 600 nm to 660 nm.

The red phosphorescent dopant material is a material which is capable of emitting red light. An EL spectrum of light emitted from the organic light emitting layer EML doped with the red phosphorescent dopant material has a peak in a red wavelength area or has a peak in a wavelength region corresponding to red.

The red phosphorescent dopant material may be formed of a material including any one or more of a iridium (Ir) ligand complex including Ir(ppy)3(fac tris(2-phenylpyridine)iridium)(tris(2-phenylpyridine)iridium), PIQIr(acac)(bis(1-phenylisoquinoline) acetylacetonate iridium), PQIr (acac)(bis(1-phenylquinoline) acetylacetonate iridium), PQIr(tris(1-phenylquinoline)iridium) Ir(piq)3(tris(1-phenylisoquinoline)iridium), Ir(piq)2(acac)(bis(1-phenylisoquinoline)(acetylacetonate)iridium), PtOEP(octaethylporphyrinporphine platinum) PBD:Eu(DBM)3(Phen), and perylene, but is not limited thereto.

The electron transport layer ETL is supplied with electrons from the electron injection layer EIL. The electron transport layer ETL transmits the supplied electrons to the organic light emitting layer EML.

Further, the electron transport layer ETL performs the same function as a hole blocking layer HBL. The hole blocking layer may suppress the holes which do not participate the recombination from being leaked from the organic light emitting layer EML.

For example, the electron transport layer ETL may be formed of any one or more of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline), and BAlq(bis(2-methyl-8-quinolinolate)-4-(phenylphenolato)aluminum), but is not limited thereto.

The electron injection layer EIL is a layer which smoothly injects the electron from the second electrode 117 to the organic light emitting layer EML. For example, the electron injection layer EIL may be formed of a material including any one or more of alkali metals or alkaline earth metal ion forms such as LiF, BaF2, and CsF, but is not limited thereto.

The electron injection layer EIL and the electron transport layer ETL may be omitted depending on a structure or a characteristic of the lighting apparatus 100 using an organic light emitting diode.

Referring to FIG. 3B, the organic layer 116 includes a first stack ST1 including a first organic light emitting layer EML1, a second stack ST2 including a second organic light emitting layer EML2, and a charge generating layer CGL disposed between the first stack ST1 and the stack ST2.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, a second hole transport layer HTL2, and a hole injection layer HIL and the function and the configuration of each layer are as described above.

In the meantime, the charge generating layer CGL is disposed between the first stack ST1 and the second stack ST2. The charge generating layer CGL supplies charges to the first stack ST1 and the second stack ST2 to control a charge balance between the first stack ST1 and the second stack ST2.

The charge generating layer CGL includes an N-type charge generating layer N-CGL and a P-type charge generating layer P-CGL. The N-type charge generating layer N-CGL is in contact with the second electron transport layer ETL2 and the P-type charge generating layer P-CGL is disposed between the N-type charge generating layer N-CGL and the first hole transport layer HTL1. The charge generating layer CGL may be configured by a plurality of layers including the N-type charge generating layer N-CGL and the P-type charge generating layer P-CGL, but is not limited thereto and may be configured by a single stack.

The N-type charge generating layer N-CGL injects the electrons to the first stack ST1. The N-type charge generating layer N-CGL may include an N-type dopant material and an N-type host material. The N-type dopant material may be a metal of Group 1 and Group 2 on the periodic table, an organic material which may inject the electrons, or a mixture thereof. For example, the N-type dopant material may be any one of an alkali metal and an alkaline earth metal. That is, the N-type charge generating layer N-CGL may be formed of the organic layer 116 doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material may be formed of a material which is capable of transmitting electrons, for example, may be formed of any one or more of Alq3(tris (8-hydroxyquinolino)aluminum), Liq(8-hydroxyquinolino-lato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2-(1,3,5-benzinetriyl)-tris(1-phenyl-1-H-benzimidazole), oxadiazole, triazole, phenanthroline, benzoxazole, and benzthiazole, but is not limited thereto.

The P-type charge generating layer P-CGL injects the holes to the second stack ST2. The P-type charge generating layer P-CGL may include a P-type dopant material and a P-type host material. The P-type dopant material may be formed of metal oxide, an organic material such as tetrafluoro-tetracyanoquinodimethane (F4-TCNQ), HAT-CN (Hexaazatriphenylene-hexacarbonitrile), or hexaazatriphenylene, or a metal material such as $V_2O_5$, $MoO_x$, and $WO_3$, but is not limited thereto. The P-type host material may be formed of a material which is capable of transmitting holes, for example, may be formed of a material including any one or more of NPD(N,N-dinaphthyl-N,N'-diphenyl benzidine)(N,N'-bis(naphthalene-1-yl)-N,N'-bis(phenyl)-2, 2'-dimethylbenzidine), TPD(N,N'-bis-(3-methylphenyl)-N, N'-bis-(phenyl)-benzidine), and MTDATA(4,4',4-Tris(N-3-methylphenyl-N-phenyl-amino)-triphenylamine), but is not limited thereto.

Referring to FIG. 3C, the organic layer 116 includes a first stack ST1 including a first organic light emitting layer EML1, a second stack ST2 including a second organic light emitting layer EML2, a third stack ST3 including a third organic light emitting layer EML3, a first charge generating layer CGL1 disposed between the first stack ST1 and the second stack ST2, and a second charge generating layer CGL2 disposed between the second stack ST2 and the third stack ST3.

Here, the first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, and a second hole transport layer HTL2. The third stack ST3 includes a third electron transport layer ETL3, a third organic light emitting layer EML3, a third electron blocking layer EBL3, a third hole transport layer HTL3, and a hole injection layer HIL. The function and the configuration of each layer are as described above.

The first charge generating layer CGL1 includes a first N-type charge generating layer N-CGL1 and a first P-type charge generating layer P-CGL1, and the first N-type charge generating layer N-CGL1 is in contact with the second electron transport layer ETL2. The first P-type charge generating layer P-CGL1 is disposed between the first N-type charge generating layer N-CGL1 and the first hole transport layer HTL1.

The second charge generating layer CGL2 includes a second N-type charge generating layer N-CGL2 and a second P-type charge generating layer P-CGL2, and the second N-type charge generating layer N-CGL2 is in contact with the third electron transport layer ETL3. The second P-type charge generating layer P-CGL2 is disposed between the second N-type charge generating layer N-CGL2 and the second hole transport layer HTL2. The functions and configurations of the first and second charge generating layers CGL1 and CGL2 are as described above.

Here, the first organic light emitting layer EML1 and the third organic light emitting layer EML3 are red-green organic light emitting layers and a range of a wavelength of light emitted from the first organic light emitting layer EML1 and the third organic light emitting layer EML3 may be 520 nm to 580 nm. The second organic light emitting layer EML2 is a sky blue organic light emitting layer and a range of a wavelength of light emitted from the second organic light emitting layer EML2 may be 450 nm to 480 nm.

Figure 4A:
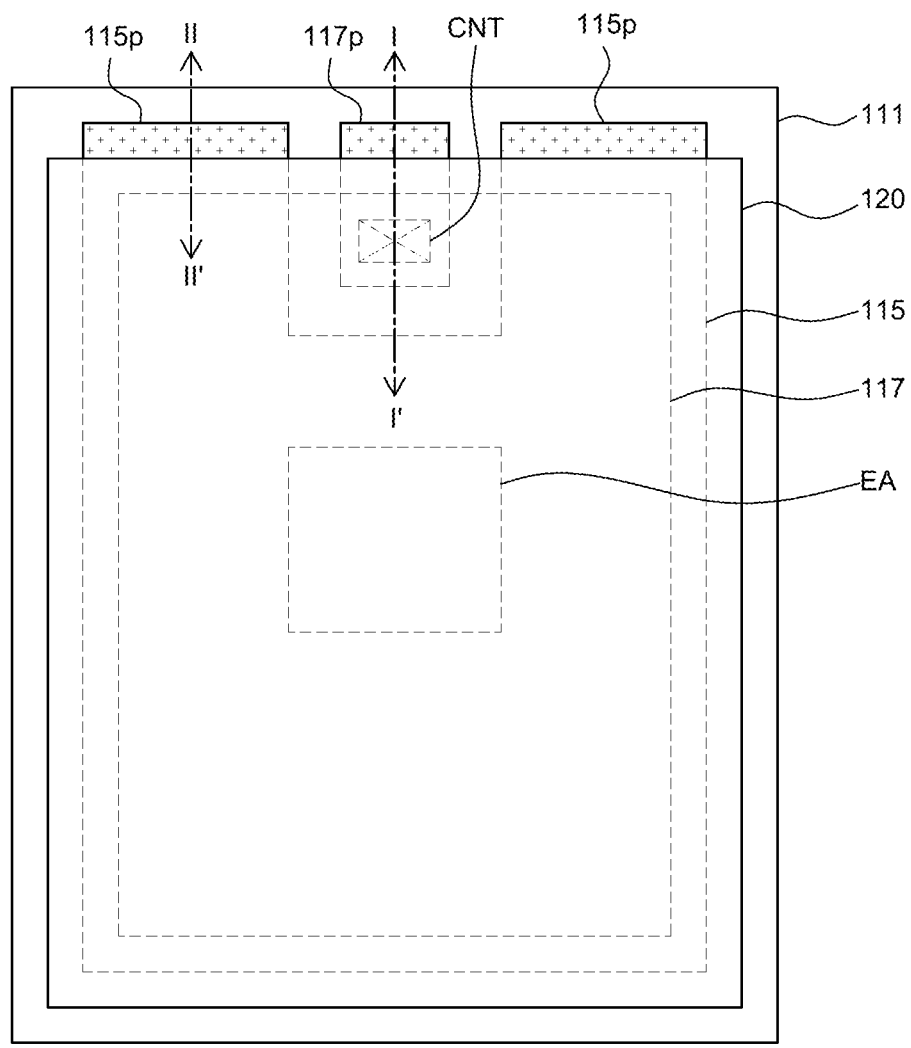
FIG. 4A is a front view of a lighting apparatus using an organic light emitting diode according to an exemplary embodiment of the present disclosure.
Figure 4B:
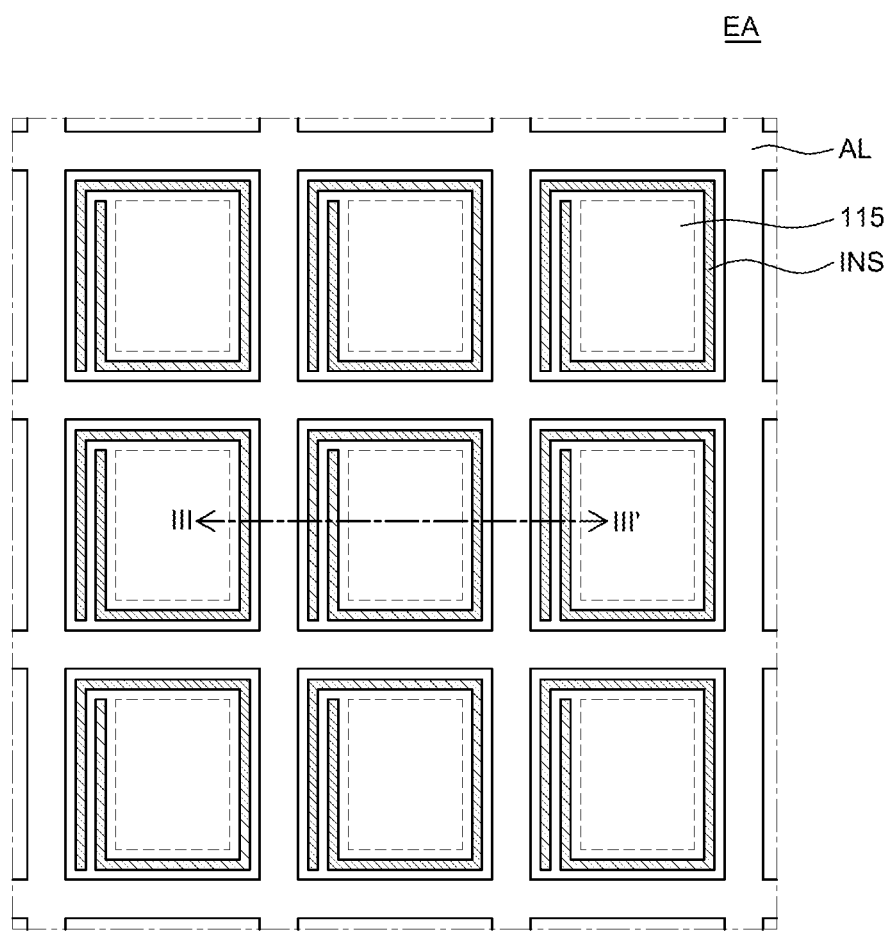
FIG. 4B is an enlarged view of a lighting unit of a lighting apparatus using an organic light emitting diode according to an exemplary embodiment of the present disclosure.

FIG. 4A is a front view of a lighting apparatus using an organic light emitting diode according to an exemplary embodiment of the present disclosure and FIG. 4B is an enlarged view of a lighting unit of a lighting apparatus using an organic light emitting diode according to an exemplary embodiment of the present disclosure.

Figure 5:
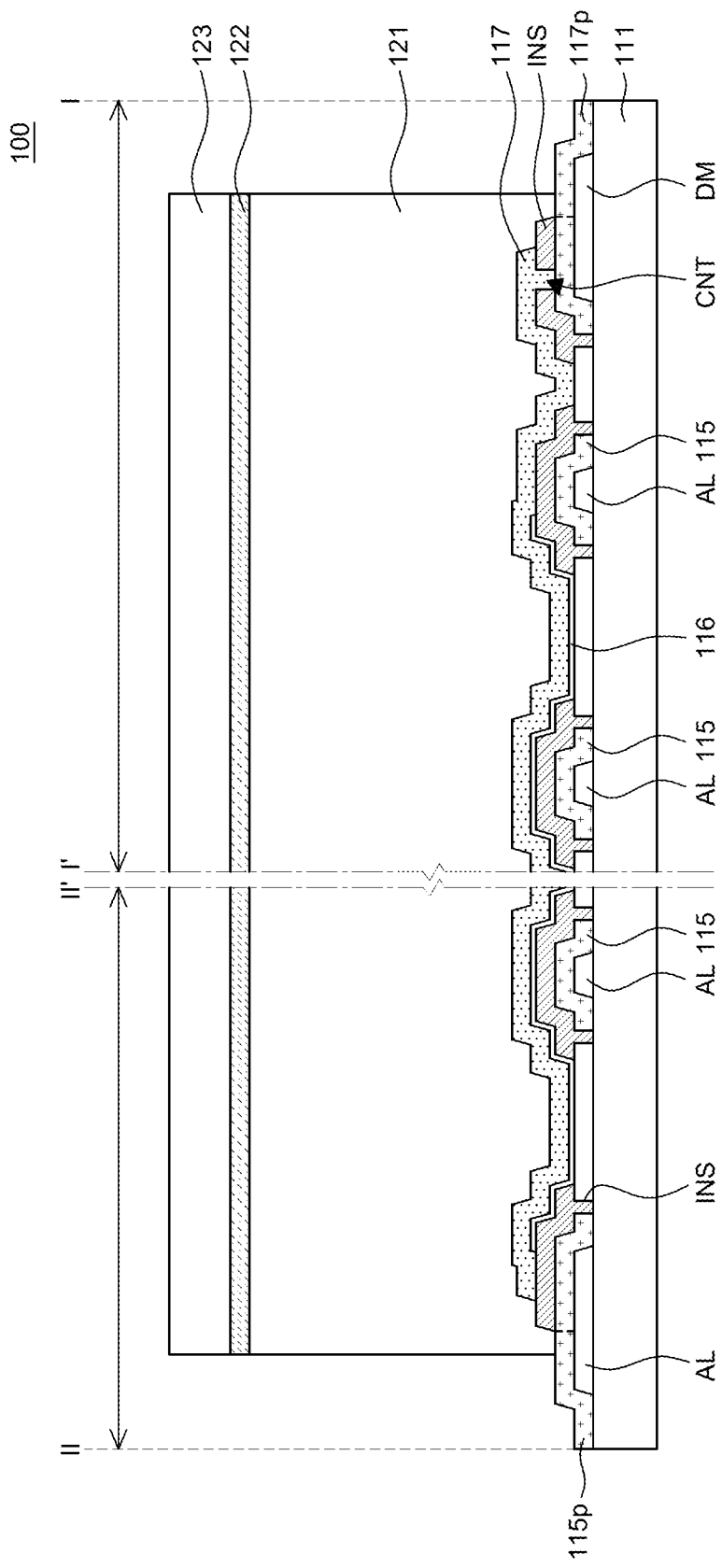
FIG. 5 is a cross-sectional view taken along the lines I-I' and II-II' of FIG. 4A.

FIG. 5 is a cross-sectional view taken along the lines I-I' and II-II' of FIG. 4A.

Specifically, FIG. 4A illustrates an arrangement relationship of the first electrode 115, the second electrode 117, and the encapsulating unit 120. A cross-sectional view of FIG. 5 taken along the line I-I' explains a connection relationship between the second electrode 117 and the second contact electrode 117p and a cross-sectional view of FIG. 5 taken along the line II-II' explains a connection relationship between the first electrode 115 and the first contact electrode 115p.

As illustrated in FIGS. 4A and 5, the first electrode 115 is disposed on the substrate 111, the second electrode 117 is disposed on the first electrode 115, and the encapsulating unit 120 is disposed so as to cover the second electrode 117.

Here, the overlapping area of the first electrode 115 and the second electrode 117 may be defined as a lighting unit EA where light is generated from the organic layer 116 disposed between the first electrode 115 and the second electrode 117.

The first electrode 115 is formed of a transparent conductive layer to have an advantage in that the emitted light transmits the first electrode, but also have a disadvantage in that an electric resistance is very high as compared with an opaque metal. Therefore, when a large size lighting apparatus 100 is manufactured, the distribution of the current applied to a large lighting unit EA is not uniform due to a high resistance of the transparent high resistive conductive layer. Therefore, the large size lighting apparatus cannot emit light with uniform luminance due to the current distribution which is not uniform.

Therefore, as illustrated in FIGS. 4B and 5, for the purpose of emission with uniform luminance of the large size lighting apparatus 100, an auxiliary line AL which is electrically connected to the first electrode 115 which makes the distribution of current applied to the lighting unit EA uniform may be disposed.

The auxiliary line AL is disposed over the entire lighting unit EA with a net shape having a small thickness, a mesh shape, a hexagonal or octagonal shape, or a circular shape. The auxiliary line AL may be made of a metal having a good conductivity such as aluminum (Al), gold (Au), copper (Cu), titanium (Ti), tungsten (W), molybdenum (Mo), or an alloy thereof. Even though not illustrated in the drawing, the auxiliary line AL may be configured to have a double-layered structure of an upper auxiliary line AL and a lower auxiliary line AL, but the present disclosure is not limited thereto and the auxiliary line may be configured by a single stack.

Here, in FIG. 5, it is illustrated that the auxiliary line AL which is electrically connected to the first electrode 115 is disposed below the first electrode 115 to be in electrical contact with the first electrode 115. However, the present disclosure is not limited thereto and the auxiliary line AL may be disposed above the first electrode 115.

Moreover, when the first electrode 115 is formed as a triple layer, the auxiliary line AL may be disposed between the triple layer of the first electrode 115.

Further, as illustrated in FIG. 4A, the first electrode 115 may be configured by an electrode layer in which a recession is formed at a center portion of one side and a first contact electrode 115P which is electrically connected to the first electrode 115 through the auxiliary line AL may extend to be disposed on both ends of one side. However, the shape of the first electrode 115 is not limited thereto, but the first electrode 115 may be formed in various shapes in which a recession is formed.

Further, a second contact electrode 117p which is separated from the first electrode 115 may be disposed in the recession of one side of the first electrode 115. As illustrated in FIG. 5, the second contact electrode 117p is electrically connected to the second electrode 117 through a connection hole CNT.

Specifically, as illustrated in FIG. 5, the first contact electrode 115p is connected to the first electrode 115 through the auxiliary line AL to form an equipotential surface with the first electrode 115. Therefore, the first contact electrode 115p, the auxiliary line AL, and the first electrode 115 are electrically connected to each other. Further, as illustrated in FIG. 5, the second contact electrode 117p is electrically connected to the second electrode 117 and a dummy electrode DM.

The above-mentioned dummy electrode DM is formed of the same material on the same layer as the auxiliary line AL and is disposed in the recession to be electrically isolated from the auxiliary line AL. Therefore, the first electrode 115 and the second electrode 117 are not electrically connected to supply the current to the organic layer 116.

Here, the first contact electrode 115p and the second contact electrode 117p may be formed of a metal having high conductivity and specifically, the first contact electrode 115p and the second contact electrode 117p may be formed of the same material on the same layer as the first electrode 115. Therefore, as it will be described below, the first electrode 115 may be formed by a triple-layered electrode pattern so that the first contact electrode 115p and the second contact electrode 117p may also be formed of a triple-layered electrode pattern like the first electrode 115.

The encapsulating unit 120 is formed so as to cover both the first electrode 115 and the second electrode 117, but exposes the first contact electrode 115p and the second contact electrode 117p. By doing this, the first contact electrode 115p and the second contact electrode 117p may be electrically connected to the outside. Therefore, the first electrode 115 may be applied with a signal through the first contact electrode 115p which is connected to the outside and the second electrode 117 may be connected to the outside through the second electrode 117 which is connected to the outside.

An insulating layer INS is disposed between the first electrode 115 and the second electrode 117 on a non-emission area where the auxiliary line AL of the lighting unit EA is disposed to suppress the short between the first electrode 115 and the second electrode 117 due to the damage of the organic layer 116.

Specifically, the insulating layer INS is configured to cover the auxiliary line AL and the first electrode 115 of the non-emission area above the auxiliary line. As described above, the insulating layer INS is formed so as to enclose the auxiliary line AL to reduce the step due to the auxiliary line AL. Therefore, various layers which are formed thereafter may be stably formed without being shorted. The insulating layer INS may be made of an inorganic material such as silicon oxide SiOx or silicon nitride SiNx. However, the insulating layer INS may be made of an organic layer such as photoacryl and also made of a plurality of layers of inorganic layers and organic layers.

Further, as illustrated in FIG. 4B, the insulating layer INS forms a short reduction pattern in the first electrode 115 to which the current is supplied to reflect a narrow path and is insulated to cover the short reduction pattern, thereby suppressing the short. That is, the short reduction pattern is formed to enclose an outer edge of the emission area of the individual pixel and adds a resistor to the individual pixels to restrict current flowing in an area where the short is generated.

FIGS. 6A to 6D are cross-sectional views taken along the line III-III' of FIG. 4B.

Referring to FIGS. 6A to 6D, the lighting apparatus 100 using an organic light emitting diode according to an exemplary embodiment of the present disclosure is divided into an emission area A1 in which first electrodes 115a, 115b, and 115c which are triple layers and an organic layer 116 are in direct contact with each other to emit light and a non-emission area A2 in which the first electrodes 115a, 115b, and 115c are covered by the insulating layer INS.

In other words, referring to FIG. 4B, the non-emission area A2 may be formed in a matrix shape which encloses an outer periphery of the emission area A1 of individual pixels.

Here, the emission area A1 of the individual pixel may be configured to be a plurality of islands and the non-emission area A2 may be formed to have a mesh shape which encloses the emission area A1.

Specifically, in the emission area A1, the organic layer 116 may be applied with charge from the first electrodes 115a, 115b, and 115c which are a triple layer to emit light. To the contrary, in the non-emission area A2, the first electrodes 115a, 115b, and 115c are covered by the insulating layer INS so as not to be in contact with the organic layer 116 so that the first electrodes 115a, 115b, and 115c may not emit light.

With regard to the above-described short reduction pattern, referring to FIGS. 6A to 6D, the insulating layer INS forms a short reduction pattern which passes through a part of the first electrodes 115a, 115b, and 115c in the non-emission area A2 to implement a narrow path in the first electrodes 115a, 115b, and 115c disposed in the non-emission area A2.

More specifically, it is necessary to form a narrow path for suppressing the short by forming an additional resistor in an outer peripheral area of the non-emission area A2 which is an intermediate area which is injected into the first electrodes 115a, 115b, and 115c which are a triple layer disposed in the emission area A1 from the auxiliary line AL disposed in the non-emission area A2.

As described above, the narrow path implemented in the non-emission area A2 suppresses the short of the first electrodes 115a, 115b, and 115c which are a triple layer disposed in the plurality of emission areas A1 so that the current flowing in the short generating area is restricted.

As described above, the first electrodes 115a and 115c disposed in the outer periphery of the non-emission area A2 so that the narrow path is formed need to be formed of a high resistive material for suppressing the short. Therefore, the first electrodes 115a and 115c may include at least one dielectric layer.

In contrast, the first electrodes 115a, 115b, and 115c disposed in the emission area A1 may include not only at least one dielectric layer, but also at least one metal layer to increase uniformity of the luminance by uniformizing the voltage in the entire emission area A1.

That is, the first electrodes 115a, 115b, and 115c disposed in the emission area A1 may include a metal layer 115b, but the first electrodes 115a and 115c disposed in the non-emission area A2 do not include a metal layer.

Specifically, the first electrodes 115a, 115b, and 115c disposed in the emission area A1 may be formed as a triple-layered electrode.

That is, the first electrodes 115a, 115b, and 115c disposed in the emission area A1 may be configured to include a lower electrode 115a, an intermediate electrode 115b, and an upper electrode 115c which are sequentially laminated on the substrate 111.

In other words, the first electrodes 115a, 115b, and 115c disposed in the emission area A1 may include the upper electrode 115c which is in contact with the organic layer 116, the intermediate electrode 115b which is in contact with the upper electrode 115c, and the lower electrode 115a which is in contact with the intermediate electrode 115b.

As described above, in the emission area A1, the first electrodes 115a, 115b, and 115c are formed as a triple layer so that the light may be emitted from the organic light emitting diode including the first electrodes 115a, 115b, and 115c, the second electrode 117, and the organic layer 116 to form a predetermined angle with a normal direction of the organic layer 116.

Specifically, the upper electrode 115c is indium tin oxide (ITO) having a thickness which is smaller than 1000 Å, the intermediate electrode 115b is silver (Ag) which is a metal having a thickness of 150 Å to 350 Å. Further, the lower electrode 115a may be dielectric having a refractive index of 1.4 to 1.5.

In this case, the light may be emitted from the organic light emitting diode unit 110 to form an angle of 15° to 20° with the normal direction of the organic layer 116. Details thereof will be described below with reference to FIG. 7.

To the contrary, the first electrodes 115a and 115c disposed in the non-emission area A2 is configured by the upper electrode 115. However, the first electrodes 115a and 115c may also be configured by the lower electrode 115a or configured to include the upper electrode 115c and the lower electrode 115a.

Specifically, in the exemplary embodiment of the present disclosure, in order to improve the luminance, the first electrodes 115a, 115b, and 115c require a transflective property so that the first electrode 115b needs to be made of a thin metal film (mainly, Ag). However, when the first electrode 115b is formed only by the metal layer, an oxidation problem is generated so that the upper electrode 115c is necessary. In this case, in order to suppress the conductivity and oxidation to the electrode, the upper electrode 115c using indium tin oxide (ITO) may be applied. Further, in the case of the metal, when the metal layer is formed on a lower layer having a bad contact property, such as glass ($SiO_2$) or polyimide (PI), problems such as contact failure may be caused. Therefore, a lower electrode 115a for improving the contact property is necessary. Therefore, ITO/Ag/ITO structures may be applied to the first electrodes 115a, 115b, and 115c.

However, in the case of the lower electrode 115a, the electrode function is not essential, so that the lower electrode may be formed of a dielectric material. In this case, the short reduction pattern is not necessarily formed to pass through the lower electrode 115a.

Figure 6A:
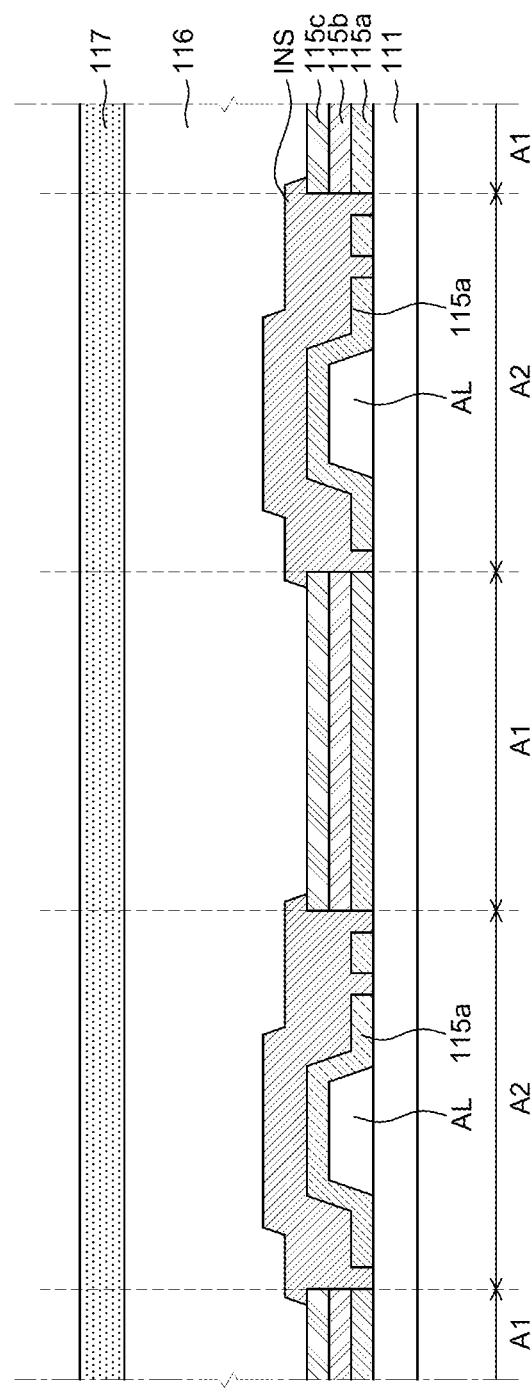
FIGS. 6A to 6D are cross-sectional views taken along the line III-III' of FIG. 4B.

Referring to FIG. 6A, in the lighting apparatus 100 using an organic light emitting diode according to an exemplary embodiment of the present disclosure, the auxiliary line AL may be disposed on the substrate 111 in the non-emission area A2 and the lower electrode 115a which is a single layer may be formed so as to cover the auxiliary line AL. Further, the insulating layer INS may be formed on the lower electrode 115a which is a single layer so as to overlap the auxiliary line AL.

In other words, the insulating layer INS is disposed in a non-emission area by the auxiliary line AL formed of an opaque metal.

The organic layer 116 and the second electrode 117 are sequentially disposed on the first electrodes 115a, 115b, and 115c in which the insulating layer INS is formed.

Figure 6B:
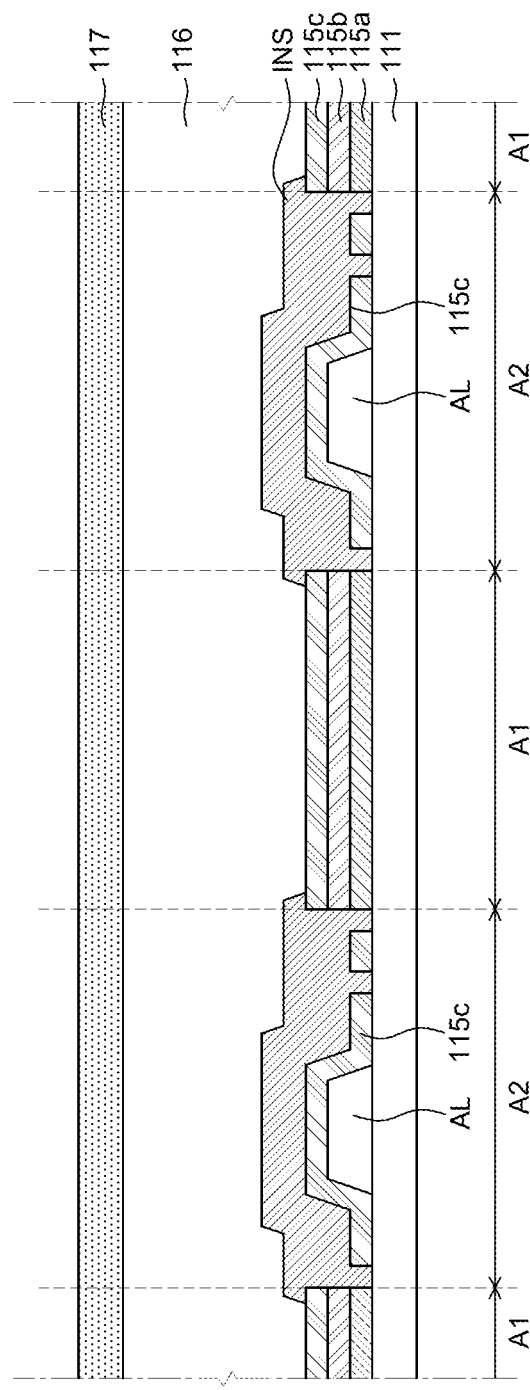

Further, referring to FIG. 6B, according to another exemplary embodiment of the present disclosure, the auxiliary line AL is disposed on the substrate 111 in the non-emission area A2 and the upper electrode 115c which is a single layer may be formed so as to cover the auxiliary line AL. Further, the insulating layer INS may be formed on the upper electrode 115c which is a single layer so as to overlap the auxiliary line AL.

In the exemplary embodiment of the present disclosure described with reference to FIG. 6A, the first electrode disposed in the non-emission area A2 is configured by the lower electrode 115a. However, in another exemplary embodiment of the present disclosure described with reference to FIG. 6B, the first electrode disposed in the non-emission area A2 is configured by the upper electrode 115c.

Figure 6C:
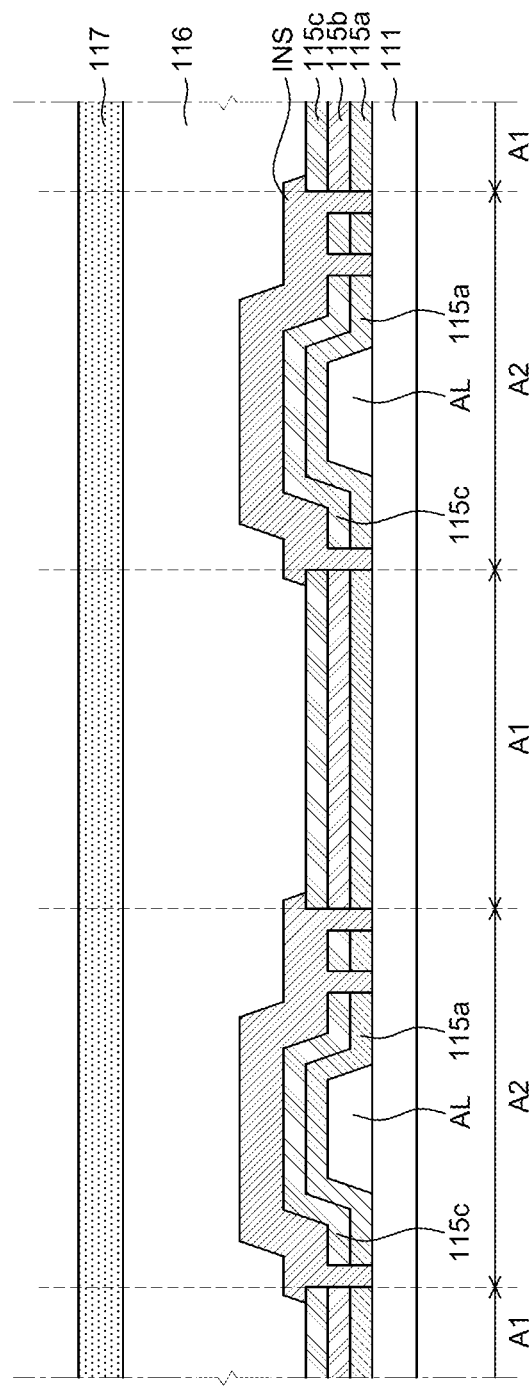
Figure 6D:
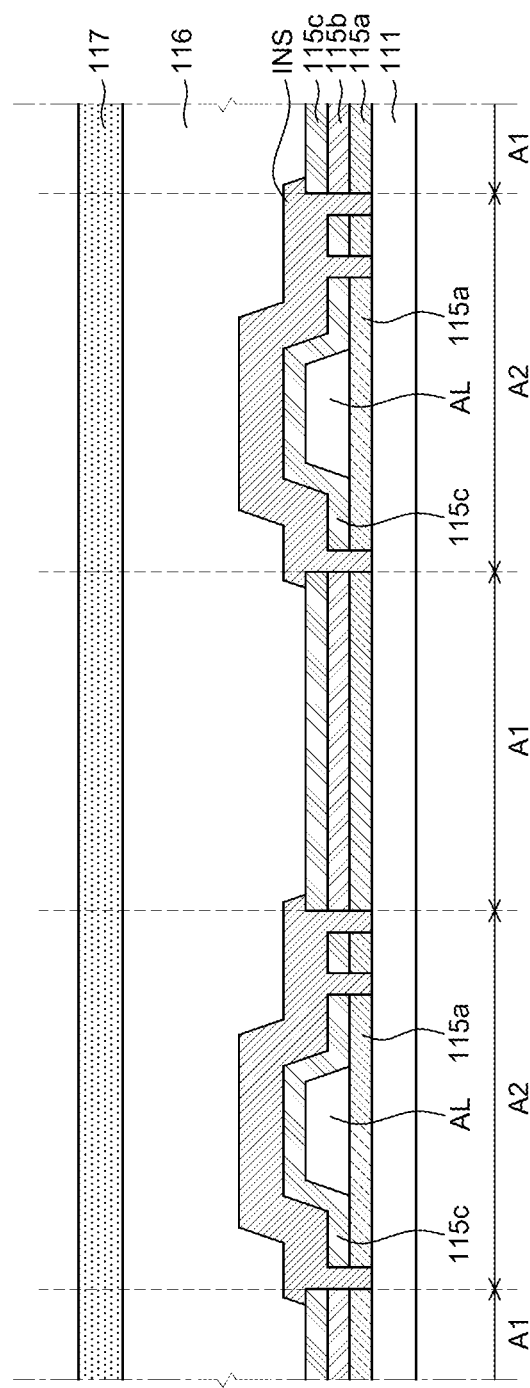

Further, as illustrated in FIGS. 6C and 6D, in another exemplary embodiment of the present disclosure, the first electrodes 115a, 115b, and 115c disposed in the non-emission area A2 may be configured to include the upper electrode 115c and the lower electrode 115a.

Specifically, as illustrated in FIG. 6C, the auxiliary line AL may be disposed on the substrate 111 in the non-emission area A2 and the lower electrode 115a and the upper electrode 115c may be sequentially laminated so as to cover the auxiliary line AL. Further, the insulating layer INS may be formed on the upper electrode 115c so as to overlap the auxiliary line AL.

In some exemplary embodiments, as illustrated in FIG. 6D, the lower electrode 115a may be disposed on the substrate 111 in the non-emission area A2, the auxiliary line AL may be disposed on the lower electrode 115a, and the upper electrode 115C may be disposed to cover the auxiliary line AL. Further, the insulating layer INS may be formed on the upper electrode 115c so as to overlap the auxiliary line AL.

Figure 7:
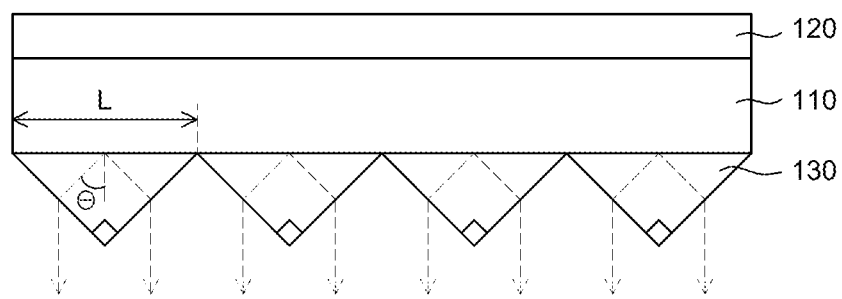
FIG. 7 is a view illustrating an emission path of a lighting apparatus including an organic light emitting diode according to an exemplary embodiment of the present disclosure.
Figure 8:
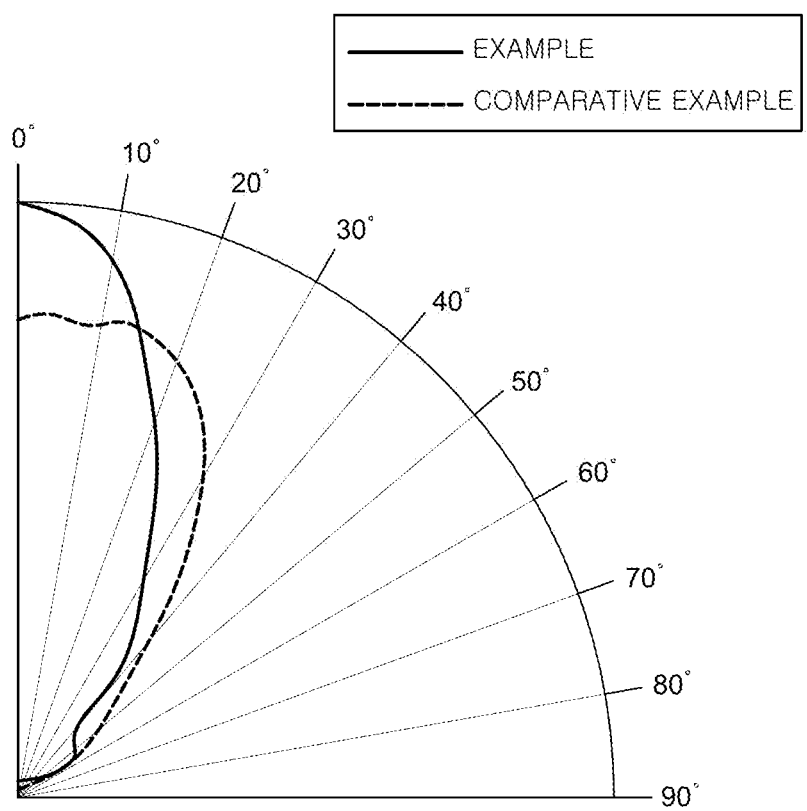
FIG. 8 is a graph for explaining a light distribution of a lighting apparatus including an organic light emitting diode according to an exemplary embodiment of the present disclosure.

FIG. 7 is a view illustrating an emission path of a lighting apparatus including an organic light emitting diode according to an exemplary embodiment of the present disclosure. FIG. 8 is a graph for explaining a light distribution of a lighting apparatus including an organic light emitting diode according to an exemplary embodiment of the present disclosure.

The external light extracting layer 130 refracts the light generated in the organic light emitting diode unit 110 while maintaining a predetermined angle to the front surface to improve the front luminance.

Specifically, as illustrated in FIGS. 1 and 7, the external light extracting layer 130 is attached to a rear surface of the organic light emitting diode unit 110 which is a light extracting direction and the external light extracting layer 130 includes at least one unit structure having a regular four-sided pyramid shape. Specifically, a cross-section of the unit structure having a regular four-sided pyramid shape may be a triangle.

A vertex angle of the unit structure having a regular four-sided pyramid is 90° and a length L of one side of lower bases is 1 µm to 500 µm.

If the length of the lower base of the unit structure is smaller than 1 µm, a pattern density by the unit structure is increased so that a moiré phenomenon that the light emitted from the lighting apparatus 100 looks like wave may be generated.

In contrast, when the length L of the lower base of the unit structure is 500 µm or larger, the auxiliary line AL disposed in the non-emission area is directly exposed so that the pattern is recognized from the outside to lower the visibility.

Therefore, a length L of one side of lower bases of the unit structure having a regular four-sided pyramid shape may be determined to be 1 µm to 500 µm.

That is, the first electrode 115 of the organic light emitting diode of the related art is formed as a single layer to form a weak resonance structure so that it is restricted to concentrate light generated in the organic light emitting diode in a specific direction. In contrast, the light generated in the organic light emitting diode is diverged in random directions so that the front luminance concentration of the lighting apparatus is lowered.

However, referring to FIG. 7, in the lighting apparatus 100 using an organic light emitting diode of the present disclosure, the light is emitted from the organic light emitting diode unit 110 to form a predetermined angle with a normal direction of the organic layer 116 and the deflected light is refracted by the external light extracting layer 130 to a front direction which is a normal direction of the organic layer 116.

Specifically, the unit structure having a regular four-sided pyramid shape of the external light extracting layer 130 has a maximum front luminance contribution rate for light which is incident approximately at 17 degrees. The reflectance of the first electrode 115 may be adjusted by adjusting a thickness of the intermediate electrode 115b and thus the intensity of resonance varies so that an outgoing angle of the light may vary. By doing this, the incident angle of light which is incident onto the unit structure having a regular four-sided pyramid shape is controlled to be approximately 17 degrees to improve the front luminance.

As a result, in the lighting apparatus 100 using an organic light emitting diode according to an exemplary embodiment of the present disclosure, the front luminance is improved to reach 12000 nit.

Referring to FIG. 8, it is confirmed that in the lighting apparatus of the related art which is a comparative example of the present disclosure, light having a similar intensity is generated at approximately 0 degree to 30 degrees.

In contrast, in the case of the lighting apparatus 100 of the exemplary embodiment of the present disclosure, it is confirmed that when the luminance is most concentrated around 0 degree of the light distribution and the luminance is sharply reduced at 30 degrees.

Therefore, it is confirmed that in the lighting apparatus 100 using an organic light emitting diode according to an exemplary embodiment of the present disclosure, the luminance is concentrated on the front surface so that the front luminance is improved.

Hereinafter, it will be described that the front luminance of the lighting apparatus 100 varies depending on a configuration of the first electrode 115 with respect to FIGS. 9A and 9B.

Figure 9A:
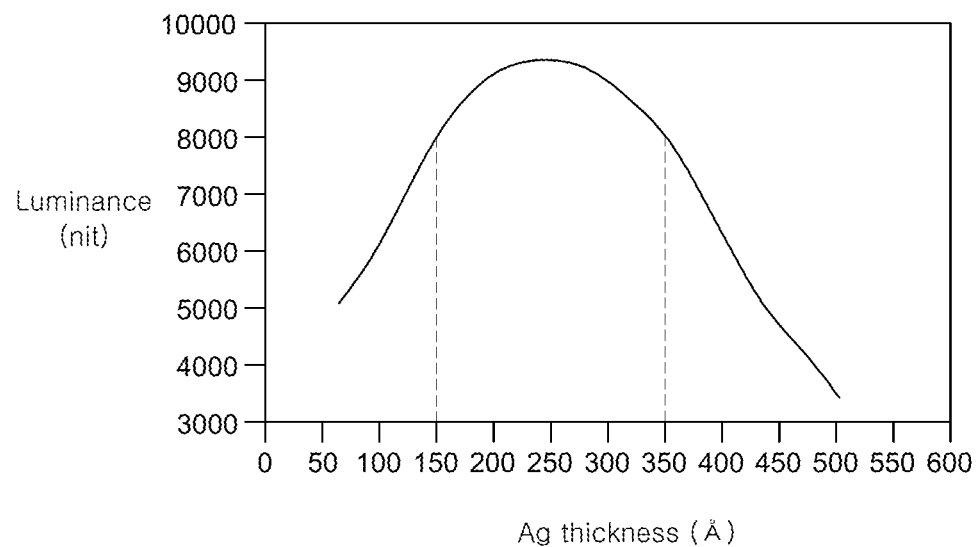
FIG. 9A is a graph illustrating a relationship of front luminance in accordance with a thickness of an intermediate electrode of an exemplary embodiment of the present disclosure.

FIG. 9A is a graph illustrating a relationship of a front luminance in accordance with a thickness of an intermediate electrode of an exemplary embodiment of the present disclosure. FIG. 9B is a graph illustrating a relationship of a front luminance in accordance with reflectance of a first electrode of an exemplary embodiment of the present disclosure.

Referring to FIG. 9A, as described above, it is confirmed that when the intermediate electrode 115b which is configured of silver (Ag) has a thickness of 150 Å to 350 Å, the lighting apparatus 100 has a front luminance of 8000 nit or higher.

Therefore, it is confirmed that when the thickness of the intermediate electrode 115b is 150 Å to 350 Å, the front luminance is improved.

Figure 9B:
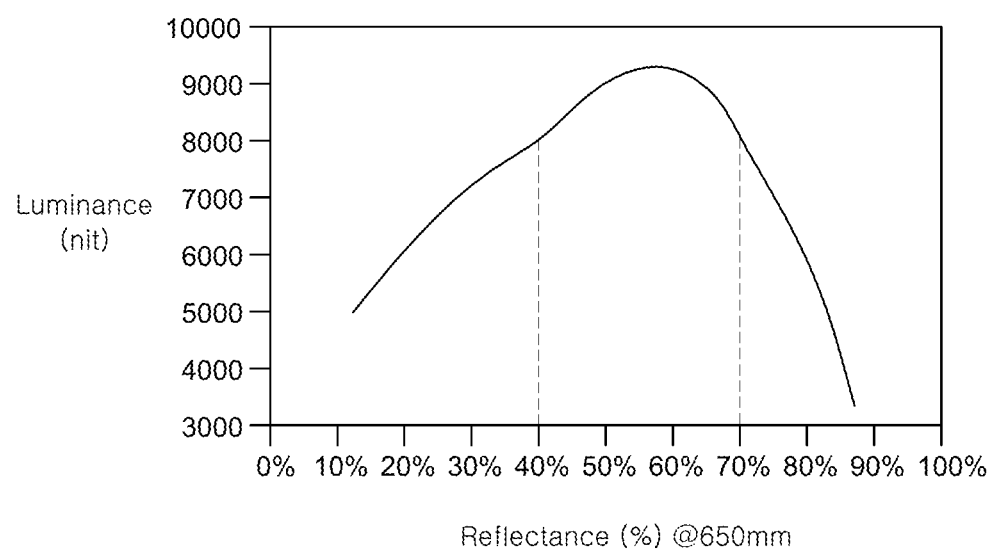
FIG. 9B is a graph illustrating a relationship of front luminance in accordance with reflectance of a first electrode of an exemplary embodiment of the present disclosure.

Further, referring to FIG. 9B, it is confirmed that the front luminance of the lighting apparatus 100 varies depending on reflectance of the first electrode 115 with respect to light having a wavelength of 650 nm.

Specifically, it is confirmed that when the reflectance of the first electrode 115 with respect to light having a wavelength of 650 nm is 40% to 70%, the lighting apparatus 100 has a front luminance of 8000 nit or higher.

Therefore, it is confirmed that when the reflectance of the first electrode 115 with respect to light having a wavelength of 650 nm is 40% to 70%, the front luminance is improved.

Figure 10A:
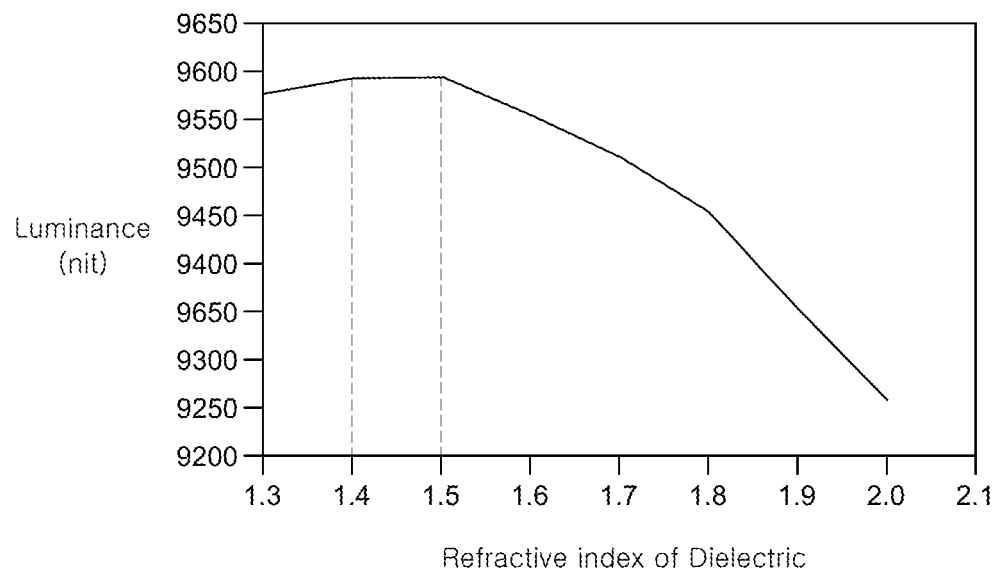
FIG. 10A is a graph illustrating a relationship of front luminance in accordance with a refractive index of a lower electrode of an exemplary embodiment of the present disclosure.
Figure 10B:
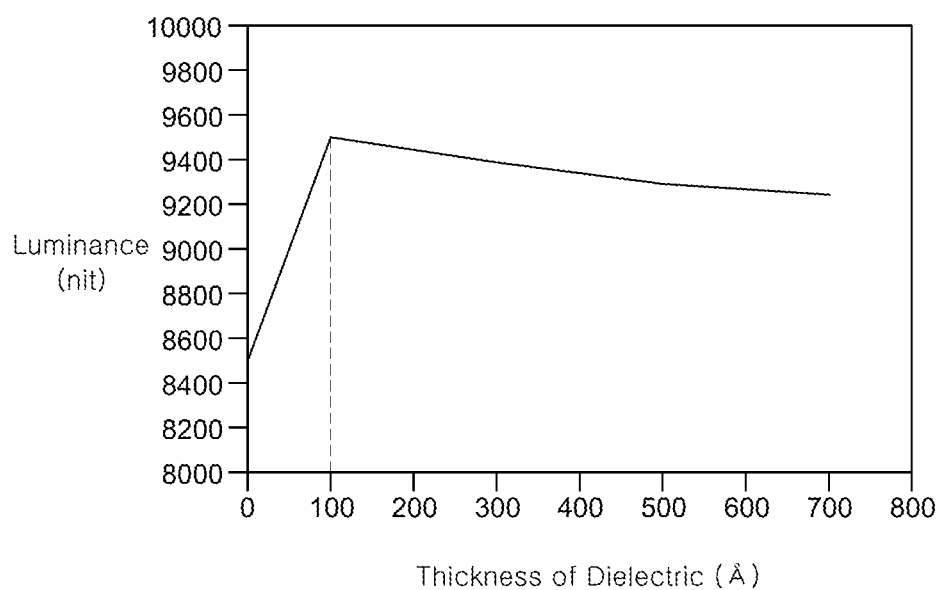
FIG. 10B is a graph illustrating a relationship of front luminance in accordance with a thickness of a lower electrode of an exemplary embodiment of the present disclosure.

FIG. 10A is a graph illustrating a relationship of a front luminance in accordance with a refractive index of a lower electrode of an exemplary embodiment of the present disclosure. FIG. 10B is a graph illustrating a relationship of a front luminance in accordance with a thickness of a lower electrode of an exemplary embodiment of the present disclosure.

Referring to FIG. 10A, it is confirmed that when the lower electrode 115a is a dielectric having a refractive index of 1.4 to 1.5, the lighting apparatus 100 outputs a maximum front luminance of 9600 nit or higher.

Therefore, it is confirmed that when the lower electrode 115a has a refractive index of 1.4 to 1.5, the front luminance is improved.

Further, referring to FIG. 10B, it is confirmed that when a thickness of the lower electrode 115a which is made of a dielectric is 100 Å, the lighting apparatus 100 may output a maximum front luminance of 9500 nit or higher. Further, it is also confirmed that when the thickness of the lower electrode 115a is increased to be larger than 100 Å, the front luminance of the lighting apparatus 100 is slightly reduced from the maximum front luminance.

Therefore, it is confirmed that when the thickness of the lower electrode 115a is 100 Å, the front luminance is improved.

The exemplary embodiments of the present disclosure can also be described as follows:

According to an aspect of the present disclosure, a lighting apparatus using an organic light emitting diode includes: a first electrode; an organic layer disposed on the first electrode; a second electrode disposed on the organic layer; and an insulating layer disposed in the non-emission area, in which the first electrode disposed in the emission area includes at least one metal layer and at least one dielectric layer and the first electrode disposed in the non-emission area includes only at least one dielectric layer to restrict the current flowing into the short generating area.

The insulating layer may include a short reduction pattern which implements a narrow path in the first electrode disposed in the non-emission area.

The first electrode disposed in the emission area may include an upper electrode which is in contact with the organic layer and is made of a dielectric material; an intermediate electrode which is in contact with the upper electrode and is made of metal; and a lower electrode which is in contact with the intermediate electrode and is made of a dielectric material.

The first electrode disposed in the non-emission area is configured by the upper electrode.

The first electrode disposed in the non-emission area is configured by the lower electrode.

The first electrode disposed in the non-emission area may include the upper electrode and the lower electrode.

The upper electrode is made of indium tin oxide (ITO) having a thickness smaller than 1000 Å.

The intermediate electrode may be made of a metal layer having a thickness of 150 Å to 350 Å.

A refractive index of the lower electrode may be 1.4 to 1.5.

A reflectance of the first electrode is 40% to 70%.

The lighting apparatus may further comprise an auxiliary line which is electrically connected to the first electrode disposed in the non-emission area.

The auxiliary line may be disposed between the upper electrode and the lower electrode.

What is claimed is:

1. A lighting apparatus using an organic light emitting diode that has an emission area and a non-emission area, the light emitting apparatus comprising:
    a first electrode;
    an organic layer disposed on the first electrode;
    a second electrode disposed on the organic layer;
    an insulating layer disposed in the non-emission area, and
    an auxiliary line disposed over an entire area of the non-emission area with a mesh shape which is electrically connected to the first electrode disposed in the non-emission area,
    wherein the first electrode disposed in the emission area includes at least one reflective layer and at least one transparent layer,
    wherein the first electrode disposed in the non-emission area only includes at least one transparent layer and does not include the at least one reflective layer, and
    wherein a top and sides of the auxiliary line are completely covered with the at least one transparent layer in the non-emission area.

2. The lighting apparatus according to claim 1, wherein the insulating layer includes a short reduction pattern which restricts current flowing in an area where a short is generated.

3. The lighting apparatus according to claim 1, wherein the first electrode disposed in the emission area includes:
    an upper electrode which is in contact with the organic layer and is made of a transparent material;
    an intermediate electrode which is in contact with the upper electrode and is made of reflective; and
    a lower electrode which is in contact with the intermediate electrode and is made of a transparent material.

4. The lighting apparatus according to claim 3, wherein the first electrode disposed in the non-emission area is configured by the upper electrode.

5. The lighting apparatus according to claim 3, wherein the first electrode disposed in the non-emission area is configured by the lower electrode.

6. The lighting apparatus according to claim 3, wherein the first electrode disposed in the non-emission area includes the upper electrode and the lower electrode.

7. The lighting apparatus according to claim 3, wherein the upper electrode is made of indium tin oxide (ITO) having a thickness smaller than 1000 Å.

8. The lighting apparatus according to claim 3, wherein the intermediate electrode is made of a reflective layer having a thickness of 150 Å to 350 Å.

9. The lighting apparatus according to claim 3, wherein a refractive index of the lower electrode is 1.4 to 1.5.

10. The lighting apparatus according to claim 1, wherein reflectance of the first electrode is 40% to 70%.

11. The lighting apparatus according to claim 3, wherein the auxiliary line is disposed between the upper electrode and the lower electrode.

12. A lighting apparatus using an organic light emitting diode that has an emission area and a non-emission area, the light emitting apparatus comprising:
    a first electrode;
    an organic layer disposed on the first electrode;
    a second electrode disposed on the organic layer;
    an insulating layer disposed in the non-emission area and including a short reduction pattern which restricts current flowing in an area where a short is generated; and
    an auxiliary line disposed over an entire area of the non-emission area with a mesh shape which is electrically connected to the first electrode disposed in the non-emission area,
    wherein the first electrode disposed in the emission area includes a transparent conductive layer, a metal layer and a dielectric layer, and the first electrode disposed in the non-emission area includes only the transparent conductive layer and the dielectric layer and does not include the metal layer, and
    wherein a top and sides of the auxiliary line are completely covered with the transparent conductive layer and the dielectric layer in the non-emission area.

13. The lighting apparatus according to claim 12, wherein the transparent conductive layer is in contact with the organic layer, the metal layer is in contact with the transparent conductive layer, and the dielectric layer is in contact with the metal layer.

14. The lighting apparatus according to claim 12, wherein the transparent conductive layer is made of indium tin oxide (ITO) having a thickness smaller than 1000 Å.

15. The lighting apparatus according to claim 12, wherein the metal layer has a thickness of 150 Å to 350 Å.

16. The lighting apparatus according to claim 12, wherein the dielectric layer has a refractive index of 1.4 to 1.5.

17. The lighting apparatus according to claim 12, wherein the first electrode has a reflectance of 40% to 70%.

* * * * *